(12) United States Patent
Wakamori et al.

(10) Patent No.: US 12,520,420 B2
(45) Date of Patent: Jan. 6, 2026

(54) WIRING SUBSTRATE

(71) Applicant: IBIDEN CO., LTD., Gifu (JP)

(72) Inventors: Hiroki Wakamori, Ogaki (JP); Ikuya Terauchi, Ogaki (JP); Takahiro Yamada, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 282 days.

(21) Appl. No.: 18/325,229

(22) Filed: May 30, 2023

(65) Prior Publication Data

US 2023/0403789 A1   Dec. 14, 2023

(30) Foreign Application Priority Data

Jun. 10, 2022  (JP) .................................. 2022-094360
Jan. 16, 2023  (JP) .................................. 2023-004514

(51) Int. Cl.
*H05K 1/02*   (2006.01)
*H05K 3/10*   (2006.01)

(52) U.S. Cl.
CPC ........... *H05K 1/0296* (2013.01); *H05K 3/108* (2013.01); *H05K 2201/09236* (2013.01); *H05K 2201/09827* (2013.01); *H05K 2203/072* (2013.01); *H05K 2203/0723* (2013.01)

(58) Field of Classification Search
CPC .......... H05K 2201/09727; H05K 2201/09736; H05K 1/0265; H05K 2201/098
See application file for complete search history.

(56) References Cited

U.S. PATENT DOCUMENTS

| 4,894,030 A | * | 1/1990 | Chavaroux | ............ H01R 4/723 174/DIG. 8 |
| 2010/0181100 A1 | * | 7/2010 | Nakano | .................... C25D 5/02 174/250 |

FOREIGN PATENT DOCUMENTS

JP   2003-258410 A   9/2003

* cited by examiner

*Primary Examiner* — Timothy J Thompson
*Assistant Examiner* — John B Freal
(74) *Attorney, Agent, or Firm* — Finnegan, Henderson, Farabow, Garrett & Dunner, LLP

(57) ABSTRACT

A wiring substrate includes an insulating layer, and a conductor layer including a wiring formed on the insulating layer. The wiring in the conductor layer has a first section and a second section formed such that a wiring width in the second section is smaller than a wiring width in the first section and that a wiring thickness in the second section is larger than a wiring thickness in the first section.

20 Claims, 3 Drawing Sheets

WIRING SUBSTRATE

CROSS-REFERENCE TO RELATED APPLICATIONS

The present application is based upon and claims the benefit of priority to Japanese Patent Applications No. 2022-094360, filed Jun. 10, 2022 and No. 2023-004514, filed Jan. 16, 2023. The entire contents of these application are incorporated herein by reference.

BACKGROUND OF THE INVENTION

Field of the Invention

The present invention relates to a wiring substrate.

Description of Background Art

Japanese Patent Application Laid-Open Publication No. 2003-258410 describes a method for manufacturing a wiring substrate. The entire contents of this publication are incorporated herein by reference.

SUMMARY OF THE INVENTION

According to one aspect of the present invention, a wiring substrate includes an insulating layer, and a conductor layer including a wiring formed on the insulating layer. The wiring in the conductor layer has a first section and a second section formed such that a wiring width in the second section is smaller than a wiring width in the first section and that a wiring thickness in the second section is larger than a wiring thickness in the first section.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
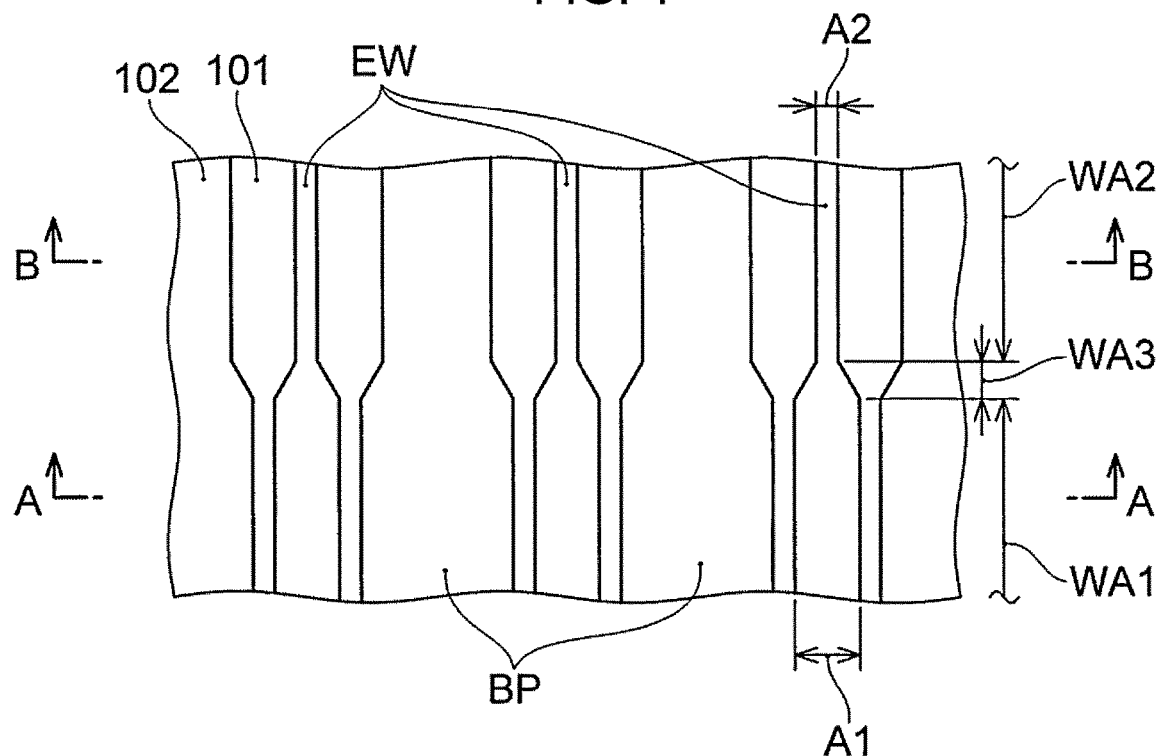
FIG. 1 is a plan view illustrating an example of a wiring substrate according to an embodiment of the present invention.

Embodiments will now be described with reference to the accompanying drawings, wherein like reference numerals designate corresponding or identical elements throughout the various drawings.

A wiring substrate according to an embodiment of the present invention is described with reference to the drawings.

Figure 2A:
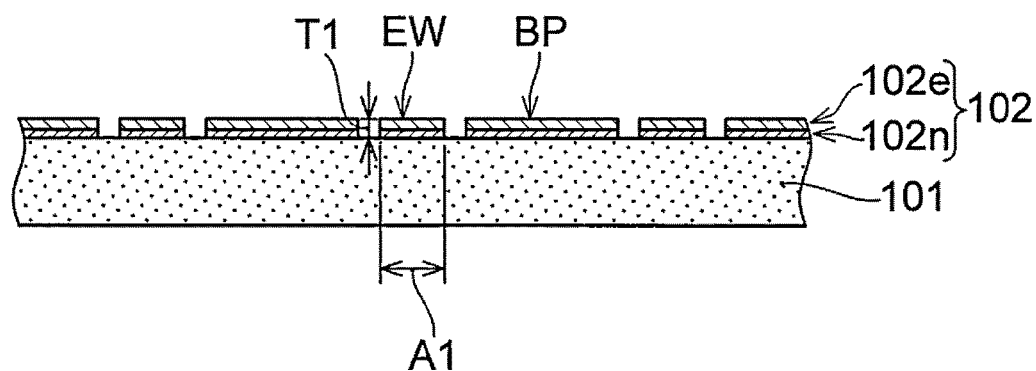
FIG. 2A is a cross-sectional view along an A-A line in FIG. 1.
Figure 2B:
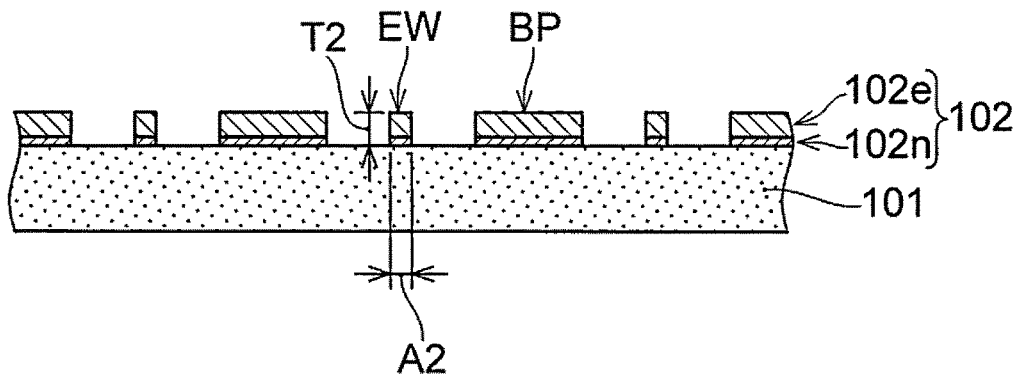
FIG. 2B is a cross-sectional view along a B-B line in FIG. 1.

FIG. 1 illustrates a plan view of a wiring substrate, which is an example of the wiring substrate of the embodiment. FIG. 2A illustrates a cross-sectional view along an A-A line in FIG. 1, and FIG. 2B illustrates a cross-sectional view along a B-B line in FIG. 1. The plan view illustrated in FIG. 1 and the cross-sectional views illustrated in FIGS. 2A and 2B each illustrate a portion that includes a conductor layer 102 and an insulating layer 101, which are any layers that the wiring substrate of the embodiment may have among multiple insulating layers and multiple conductor layers that the wiring substrate of the embodiment can have. An insulating layer may be further laminated on the conductor layer 102 on the opposite side with respect to the insulating layer 101. Further, a conductor layer may be formed on the insulating layer 101 on the opposite side with respect to the conductor layer 102.

In the description of the wiring substrate of the present embodiment, in a thickness direction of the insulating layer 101, the side on which the conductor layer 102 is formed is referred to as "upper" or an "upper side," and the side opposite to the side on which the conductor layer 102 is formed is referred to as "lower" or a "lower side."

The insulating layer 101 is, for example, any insulating layer among multiple insulating layers that may be included in a wiring substrate in a form of a so-called build-up wiring substrate, and may be formed, for example, using an epoxy resin. The insulating layer 101 may also be formed using an insulating resin such as, for example, a bismaleimide triazine resin (BT resin) or a phenol resin. The insulating layer 101 may contain a reinforcing material (core material) such as a glass fiber and/or an inorganic filler such as silica and alumina.

The conductor layer 102 formed on the insulating layer 101 may be formed using any metal such as copper or nickel. The conductor layer 102 may be formed of, for example, a metal foil such as copper foil and/or a metal film formed by plating or sputtering or the like. In the illustrated example, the conductor layer 102 formed on a surface of the insulating layer 101 has a two-layer structure including an electroless plating film layer ($102n$) (preferably an electroless copper plating film) and an electrolytic plating film layer ($102e$) (preferably an electrolytic copper plating film). However, the structure of the conductor layer 102 is not limited to the two-layer structure including the electroless plating film layer ($102n$) and the electrolytic plating film layer ($102e$). It is also possible that the conductor layer 102 has a layered structure of three or more layers, including a metal foil layer, an electroless plating film layer, and an electrolytic plating film layer.

The conductor layer 102 included in the wiring substrate of the embodiment is patterned to have wirings (EW) as its conductor patterns. Each of the three wirings (EW) illustrated in the drawing has multiple sections with different wiring widths in a length direction of the wirings (EW). Specifically, the wirings (EW) have a first section (WA1) with a relatively large wiring width, and a second section (WA2) with a smaller wiring width than the first section (WA1). A wiring width (A1) of the first section (WA1) is larger than a wiring width (A2) of the second section (WA2). Further, in the illustrated example, the multiple wirings (EW) are respectively adjacent to so-called solid patterns (BP) that are included in the conductor layer 102 and each spread in a planar direction (extension direction of the surface of the insulating layer 101).

FIG. 2A illustrates a cross section along a wiring width direction of a portion corresponding to the first section (WA1) of the wirings (EW), and FIG. 2B illustrates a cross section along a wiring width direction of a portion corresponding to the second section (WA2) of the wirings (EW). As seen from a comparison between FIG. 2A and FIG. 2B, regarding thicknesses of the wirings (EW), a wiring thickness (T2) in the second section (WA2) is larger than a wiring thickness (T1) in the first section (WA1). That is, the wirings (EW) have the first section (WA1) with a relatively large wiring width and a relatively small wiring thickness, and the second section (WA2) with a relatively small wiring width and a relatively large wiring thickness.

The wiring width (A2) of the second section (WA2) is smaller than the wiring width (A1) of the first section (WA1), and the wiring thickness (T2) of the second section (WA2) is larger than the wiring thickness (T1) of the first section (WA1). In this way, by making the wiring thickness relatively large in the second section (WA2) where the wiring width of the wirings (EW) is relatively small, it may be possible to reduce the risk of disconnection of the wirings (EW), especially in the second section (WA2).

For example, specifically, in the first section (WA1) of the wirings (EW), the wiring width is formed to be about 12-95 μm and the wiring thickness is about 8-15 μm. On the other hand, in the second section (WA2) of the wirings (EW), the wiring width is formed to about 7-90 μm and the wiring thickness is about 12-18 μm.

By making the wiring thickness relatively large in the second section (WA2) where the wiring width of the wirings (EW) is relatively small, it may be possible to suppress a degree of variation in resistance value in the same wiring (EW). That is, it may be possible to suppress, in the same wiring (EW), a degree of variation in cross-sectional area along the width direction and perpendicular to the wiring length direction.

Specifically, in the wirings (EW), a difference between the cross-sectional area perpendicular to the wiring length direction in the first section (WA1) where the wiring width is relatively large and the cross-sectional area perpendicular to the wiring length direction in the second section (WA2) where the wiring width is relatively small can be suppressed by adjusting the wiring thicknesses in the sections. For example, for the wirings (EW), when the wiring width (A1) in the first section (WA1) is about 30 μm and the wiring width (A2) in the second section (WA2) is about 20 μm, the wiring thickness (T1) in the first section (WA1) is about 10 μm and the wiring thickness (T2) in the second section (WA2) is about 15 μm.

Preferably, the cross-sectional area perpendicular to the wiring length direction along the wiring width direction in the first section (WA1) and the cross-sectional area perpendicular to the wiring length direction along the wiring width direction in the second section (WA2) are made substantially constant. In other words, for the wirings (EW), an electrical resistance value per unit length in the wiring length direction in the first section (WA1) and an electrical resistance value per unit length in the wiring length direction in the second section (WA2) are substantially the same. As described above, by adjusting the relationship between the wiring width (A1) and the wiring thickness (T1) in the first section (WA1) and the wiring width (A2) and the wiring thickness (T2) in the second section (WA2), the wirings (EW) are provided for which the risk of disconnection is reduced and the variation in resistance value is suppressed.

From a point of view of adhesion between an additional insulating layer that is coated on the conductor layer 102, and the conductor layer 102 and the insulating layer 101 exposed between the patterns of the conductor layer 102, it may be desirable that a degree of difference in conductor thickness in the conductor layer 102 be small. Therefore, it may be desirable that, in the wirings (EW), a difference in wiring thickness between the first section (WA1) and the second section (WA2) be 15 μm or less. Further, from a point of view of suppressing the difference in wiring thickness while suppressing the variation in resistance value in the same wiring, the difference in wiring width in the same wiring (EW) (the difference in wiring width between the first section (WA1) and the second section (WA2)) is preferably 30 μm or less, and more preferably 10 μm or less.

As described later in describing a method for manufacturing the wiring substrate, in forming the conductor layer 102, it may be possible that by adjusting an amount of a conductor to be formed around the wirings (EW), adjustment of the thicknesses of the wirings (EW) is achieved with relatively high accuracy. Therefore, in the formed conductor layer 102, it may be possible that, for the wirings (EW), an amount of a conductor present around the first section (WA1) and an amount of a conductor present around the second section (WA2) are different from each other.

As illustrated in FIG. 1, a section is formed between the first section (WA1) and the second section (WA2), in which the wiring width gradually decreases from the first section (WA1) to the second section (WA2). The section interposed between the first section (WA1) and the second section (WA2), in which the wiring width gradually changes, is referred to as a third section (WA3). In the third section (WA3) in which the wiring width gradually decreases from the first section (WA1) to the second section (WA2), the wiring thickness gradually increases from the first section (WA1) to the second section (WA2).

As described above, the cross-sectional area perpendicular to the wiring length direction in the first section (WA1) and the cross-sectional area perpendicular to the wiring length direction in the second section (WA2) are substantially the same, a cross-sectional area perpendicular to the wiring length direction in the third section (WA3) is also made substantially the same as the cross-sectional area in each of the first section (WA1) and the second section (WA2).

In this case, in the third section (WA3), the wiring thickness gradually changes such that the cross-sectional area remains constant as the wiring width gradually changes. Specifically, in the third section (WA3), as the wiring width gradually decreases from the first section (WA1) to the second section (WA2), the wiring thickness is gradually increased such that the cross-sectional area remains constant from the first section (WA1) to the second section (WA2). As a result, it may be possible that the electrical resistance value per unit length in the same wiring (EW) is substantially constant.

A wiring substrate according to an embodiment may be manufactured using a general method for manufacturing a wiring substrate. With reference to FIGS. 3A-3H, a method for manufacturing the wiring substrate is described using, as an example, a case where the conductor layer 102 on the insulating layer 101 of the wiring substrate illustrated in FIG. 1 is manufactured. In the following, in the manufacturing method to be described with reference to FIGS. 3A-3H, similar to FIGS. 2A and 2B, a cross-sectional view of a portion corresponding to the insulating layer 101 and the conductor layer 102 of the wiring substrate is illustrated, and in particular, the manufacture of the conductor layer 102 is described.

Figure 3A:
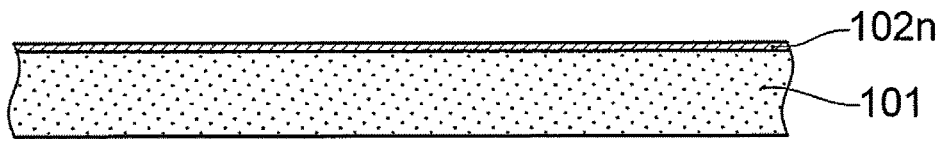
FIG. 3A illustrates an example of a method for manufacturing a wiring substrate according to an embodiment of the present invention.

First, as illustrated in FIG. 3A, a laminate is prepared which is obtained by completing processes up to the lamination of the insulating layer 101. As the insulating layer 101, for example, a resin film containing an insulating resin such as an epoxy resin, a bismaleimide triazine resin (BT resin), or a phenol resin may be used. A metal film layer (102n) is formed on an entire surface on one side of the insulating layer 101. For example, the metal film layer (102n), which is an electroless copper plating film layer, is formed by electroless plating. It is also possible that the metal film layer (102n) is formed, for example, by sputtering with a target containing copper.

Figure 3B:
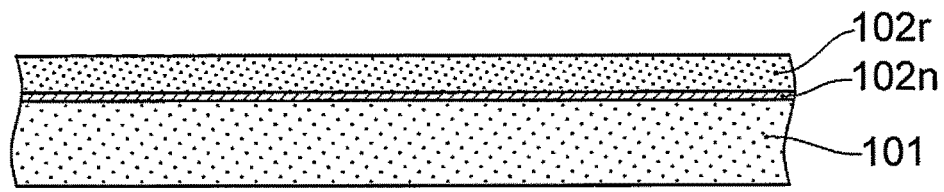
FIG. 3B illustrates an example of a method for manufacturing a wiring substrate according to an embodiment of the present invention.

Next, as illustrated in FIG. 3B, a plating resist (102r) for electrolytic plating is formed on the metal film layer (102n). For example, a plating resist (102r) containing a photosensitive polyhydroxy ether resin, epoxy resin, phenolic resin, or polyimide resin, or the like is formed by spray coating or applying a film or the like on an entire section on the metal film layer (102n) so as to cover the entire section.

Figure 3C:
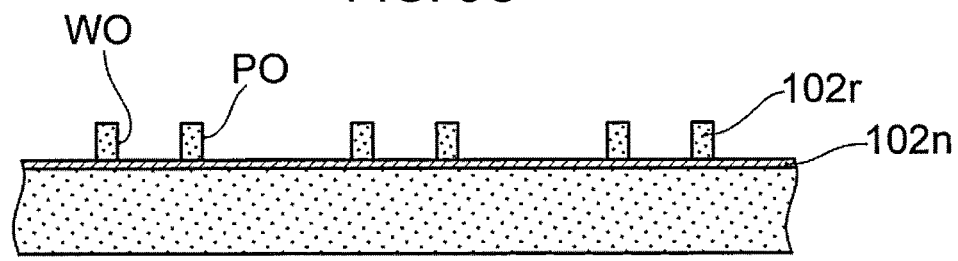
FIG. 3C illustrates an example of a method for manufacturing a wiring substrate according to an embodiment of the present invention.
Figure 3D:
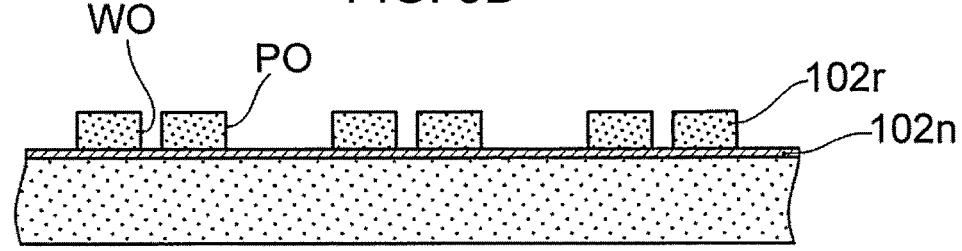
FIG. 3D illustrates an example of a method for manufacturing a wiring substrate according to an embodiment of the present invention.
Figure 3E:
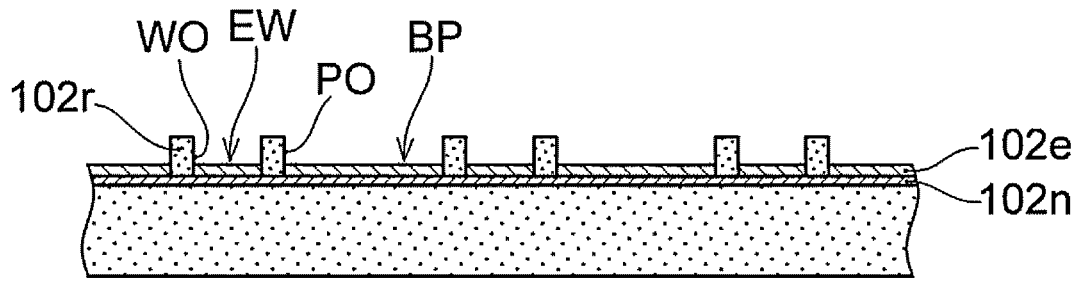
FIG. 3E illustrates an example of a method for manufacturing a wiring substrate according to an embodiment of the present invention.
Figure 3F:
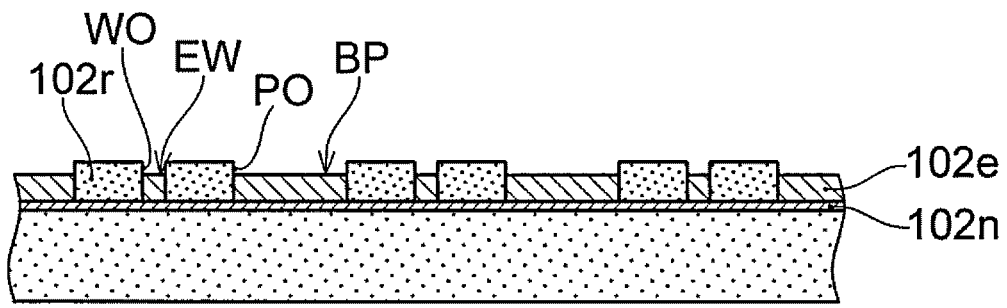
FIG. 3F illustrates an example of a method for manufacturing a wiring substrate according to an embodiment of the present invention.
Figure 3G:
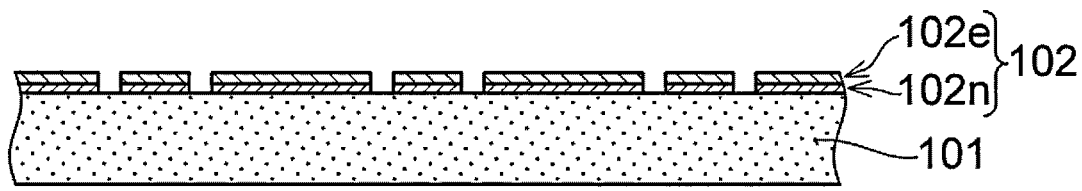
FIG. 3G illustrates an example of a method for manufacturing a wiring substrate according to an embodiment of the present invention.
Figure 3H:
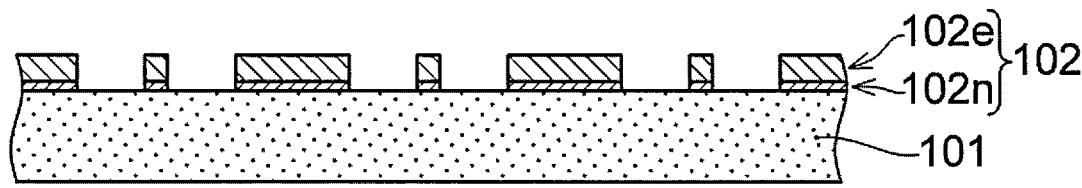
FIG. 3H illustrates an example of a method for manufacturing a wiring substrate according to an embodiment of the present invention.

Next, as illustrated in FIGS. 3C and 3D, openings are formed in the plating resist (102r). The openings corresponding to the conductor patterns (see FIG. 1), which include the wirings (EW) and the solid patterns (BP) to be included in the conductor layer 102, are formed in the plating resist (102r). FIG. 3C, and FIGS. 3E and 3G to be referenced later, illustrate a portion corresponding to the cross section of the first section (WA1) illustrated in FIG. 2A referenced in the description of the wiring substrate of the embodiment. FIG. 3D, and FIGS. 3F and 3H to be referenced later, illustrate a portion corresponding to the cross section of the second section (WA2) illustrated in FIG. 2B.

The openings in the plating resist (102r) are formed, for example, by exposure and development using a mask having suitable opening patterns. Specifically, in the plating resist (102r), openings (WO) according to the patterns of the wirings (EW) to be formed are formed, and openings (PO) according to the solid patterns (BP) to be formed are formed.

As seen from a comparison between FIG. 3C and FIG. 3D, the openings (WO) in the portion corresponding to the second section (WA2) of the wirings (EW) to be formed are formed to have a smaller opening width than the openings (WO) in the portion corresponding to the first section (WA1). The openings (WO) in the portion corresponding to the second section (WA2) of the wirings (EW) to be formed are formed to have an opening width of about 7-90 μm, and the openings (WO) in the portion corresponding to the first section (WA1) of the wirings (EW) to be formed are formed to have an opening width of about 12-95 μm.

The openings (PO) that are respectively formed adjacent to the openings (WO) are formed such that in a plan view, a ratio of an area occupied by the openings (WO, PO) in an area of a section around the openings (WO) in the portion corresponding to the first section (WA1) and a ratio of an area occupied by the openings (WO, PO) in an area of a section around the openings (WO) in the portion corresponding to the second section (WA2) are different from each other.

By forming the openings (PO) such that the ratio of the area occupied by the openings (WO, PO) in the section around the openings (WO) corresponding to the second section (WA2) is smaller than the ratio of the area occupied by the openings (WO, PO) in the section around the openings (WO) corresponding to the first section (WA1), subsequent formation of an electrolytic plating layer (102e) to be described with reference to FIGS. 3E and 3F can be satisfactorily realized. It may be possible that the openings (WO) as illustrated in FIGS. 3E and 3F can be satisfactorily filled with the electrolytic plating layer (102e) having different thicknesses.

Next, as illustrated in FIGS. 3E and 3F, the openings (WO, PO) are filled with a conductor by electrolytic plating, and the electrolytic plating layer (102e) is formed. By electrolytic plating using the metal film layer (102n) as a seed layer, the openings (WO) of the plating resist (102r) are filled with a conductor, and the electrolytic plating layer (102e) of the wirings (EW) is formed, and at the same time, the openings (PO) are filled with a conductor, and the electrolytic plating layer (102e) of the solid patterns around the wirings (EW) is formed.

In the formation of the electrolytic plating layer (102e), as illustrated in FIGS. 3E and 3F, the electrolytic plating layer (102e) illustrated in FIG. 3F in the portion corresponding to the second section (WA2) of the wirings (EW) to be formed is formed thicker than the electrolytic plating layer (102e) illustrated in FIG. 3E in the portion corresponding to the first section (WA1) of the wirings (EW) to be formed. When the ratio of the area occupied by the opening (PO) in the section around the openings (WO) is different, as described above, the thickness of the electrolytic plating layer (102e) formed in the openings (WO, PO) can be different. Specifically, by appropriately adjusting electrolytic plating conditions (temperature, plating time, and the like) associated with current density distribution related to the arrangement of the openings (WO) and the openings (PO), it may be possible that the electrolytic plating layer (102e) with different thicknesses in sections where the ratio of the area occupied by the openings (PO) in the section around the openings (WO) differs can be relatively satisfactorily formed.

The wiring thickness (thickness of the metal film layer (102n) and the electrolytic plating layer (102e)) of the wirings (EW) illustrated in FIG. 3E corresponding to the first section (WA1) can formed to be 8-15 μm when the width of the openings (WO) (wiring width) is 12-95 μm. In comparison, the wiring thickness of the wirings (EW) illustrated in FIG. 3F corresponding to the second section (WA2) can be formed to be 12-18 μm when the width of the openings (WO) is 7-90 μm. In this way, it may be possible that, by adjusting the wiring thickness with respect to the wiring width, the wiring cross-sectional areas in the first section (WA1) and the second section (WA2) of the wirings (EW) to be formed are adjusted to be substantially equal to each other.

Next, as illustrated in FIGS. 3G and 3H, the plating resist (102r) is removed, and the metal film layer (102n) exposed by the removal of the plating resist (102r) is removed by etching. The formation of the conductor layer 102 including the wirings (EW) is completed. In the manufacture of the wiring substrates, after the formation of the conductor layer 102 is completed, any additional insulating layers and conductor layers may be further laminated on the conductor layer 102.

The conductor layer 102 of the wiring substrate of the embodiment is not limited to that having the structure illustrated in the drawings and that having the structure, shape, and material exemplified in the present specification. The wirings (EW) included in the conductor layer 102 may at least have the first section (WA1) with a relatively large wiring width and a relatively small wiring thickness and the second section (WA2) with a smaller wiring width and a larger wiring thickness than the first section (WA1). It may be possible that the wirings (EW) further have a fourth section with different wiring width and wiring thickness from the first section (WA1) and the second section (WA2). Further, via conductors can be formed in the insulating layer 101 of the wiring substrate to connect the conductor layer 102 and a conductor layer that can be formed on the opposite side with respect to the conductor layer 102.

In a method for manufacturing a wiring substrate described in Japanese Patent Application Laid-Open Publication No. 2003-258410, an upper surface of an electrolytic copper plating layer that forms a wiring conductor is polished, and the wiring conductor is formed to have a uniform thickness.

In a wiring substrate manufactured using the manufacturing method described in Japanese Patent Application Laid-Open Publication No. 2003-258410, the thickness of the wiring conductor is kept constant by polishing regardless of a density or a pattern width of the wiring conductor. It is thought that when a wiring width is relatively small, a reduction in wiring thickness may increase the risk of disconnection.

A wiring substrate according to an embodiment of the present invention includes: an insulating layer; and a conductor layer including a wiring formed on the insulating layer. The wiring includes a first section and a second section having different wiring thicknesses. A wiring width in the second section is smaller than a wiring width in the first section. A wiring thickness in the second section is larger than a wiring thickness in the first section.

According to an embodiment of the present invention, in the same wiring, the wiring thickness in a section with a relatively small wiring width (the second section) is larger than that in a section with a relatively large wiring width (the first section). It is thought that it is possible to reduce the risk of disconnection in a section where the wiring width is relatively small.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
an insulating layer; and
a conductor layer including a wiring formed on the insulating layer,
wherein the wiring in the conductor layer has a first section and a second section formed such that a wiring width in the second section is smaller than a wiring width in the first section and that a wiring thickness in the second section is larger than a wiring thickness in the first section, and the wiring in the conductor layer is formed such that a cross-sectional area perpendicular to a length direction of the wiring in the first section is substantially equal to a cross-sectional area perpendicular to the length direction of the wiring in the second section.

2. The wiring substrate according to claim 1, wherein the wiring in the conductor layer is formed such that the second section has the wiring width of 90 μm or less and the wiring thickness of 18 μm or more.

3. The wiring substrate according to claim 2, wherein the wiring in the conductor layer has a third section interposed between the first section and the second section such that a wiring width in the third section decreases from a first section side toward a second section side and that a wiring thickness in the third section increases from the first section side toward the second section side.

4. The wiring substrate according to claim 3, wherein the wiring in the conductor layer is formed such that a cross-sectional area along a wiring width direction in the first section is substantially equal to a cross-sectional area along the wiring width direction in the second section, and the cross-sectional area along the wiring width direction in the second section is substantially equal to a cross-sectional area along the wiring width direction in the third section.

5. The wiring substrate according to claim 2, wherein the wiring in the conductor layer is formed such that a difference in wiring width between the first section and the second section is 10 μm or less and that a difference in wiring thickness between the first section and the second section is 15 μm or less.

6. The wiring substrate according to claim 2, wherein the wiring in the conductor layer includes a metal film layer and an electrolytic plating layer formed on the metal film layer and is formed such that a thickness of the electrolytic plating layer of the wiring in the second section is greater than a thickness of the electrolytic plating layer of the wiring in the first section.

7. The wiring substrate according to claim 3, wherein the wiring in the conductor layer includes a metal film layer and an electrolytic plating layer formed on the metal film layer and is formed such that a thickness of the electrolytic plating layer of the wiring in the third section increases from the first section side toward the second section side.

8. The wiring substrate according to claim 1, wherein the wiring in the conductor layer has a third section interposed between the first section and the second section such that a wiring width in the third section decreases from a first section side toward a second section side and that a wiring thickness in the third section increases from the first section side toward the second section side.

9. The wiring substrate according to claim 8, wherein the wiring in the conductor layer is formed such that a cross-sectional area along a wiring width direction in the first section is substantially equal to a cross-sectional area along the wiring width direction in the second section, and the cross-sectional area along the wiring width direction in the second section is substantially equal to a cross-sectional area along the wiring width direction in the third section.

10. The wiring substrate according to claim 8, wherein the wiring in the conductor layer includes a metal film layer and an electrolytic plating layer formed on the metal film layer and is formed such that a thickness of the electrolytic plating layer of the wiring in the third section increases from the first section side toward the second section side.

11. The wiring substrate according to claim 8, wherein the wiring in the conductor layer is formed such that a difference in wiring width between the first section and the second section is 10 µm or less and that a difference in wiring thickness between the first section and the second section is 15 µm or less.

12. The wiring substrate according to claim 1, wherein the wiring in the conductor layer is formed such that a difference in wiring width between the first section and the second section is 10 µm or less and that a difference in wiring thickness between the first section and the second section is 15 µm or less.

13. The wiring substrate according to claim 1, wherein the wiring in the conductor layer includes a metal film layer and an electrolytic plating layer formed on the metal film layer and is formed such that a thickness of the electrolytic plating layer of the wiring in the second section is greater than a thickness of the electrolytic plating layer of the wiring in the first section.

14. A wiring substrate, comprising:
an insulating layer; and
a conductor layer including a wiring formed on the insulating layer,
wherein the wiring in the conductor layer has a first section and a second section formed such that a wiring width in the second section is smaller than a wiring width in the first section and that a wiring thickness in the second section is larger than a wiring thickness in the first section, and the wiring in the conductor layer has a third section interposed between the first section and the second section such that a wiring width in the third section decreases from a first section side toward a second section side and that a wiring thickness in the third section increases from the first section side toward the second section side.

15. A wiring substrate, comprising:
an insulating layer; and
a conductor layer including a wiring formed on the insulating layer,
wherein the wiring in the conductor layer has a first section and a second section formed such that a wiring width in the second section is smaller than a wiring width in the first section and that a wiring thickness in the second section is larger than a wiring thickness in the first section, and the wiring in the conductor layer includes a metal film layer and an electrolytic plating layer formed on the metal film layer and is formed such that a thickness of the electrolytic plating layer of the wiring in the second section is greater than a thickness of the electrolytic plating layer of the wiring in the first section.

16. The wiring substrate according to claim 15, wherein the wiring in the conductor layer is formed such that the second section has the wiring width of 90 µm or less and the wiring thickness of 18 µm or more.

17. The wiring substrate according to claim 15, wherein the wiring in the conductor layer has a third section interposed between the first section and the second section such that a wiring width in the third section decreases from a first section side toward a second section side and that a wiring thickness in the third section increases from the first section side toward the second section side.

18. The wiring substrate according to claim 17, wherein the wiring in the conductor layer is formed such that a cross-sectional area along a wiring width direction in the first section is substantially equal to a cross-sectional area along the wiring width direction in the second section, and the cross-sectional area along the wiring width direction in the second section is substantially equal to a cross-sectional area along the wiring width direction in the third section.

19. The wiring substrate according to claim 17, wherein the wiring in the conductor layer includes a metal film layer and an electrolytic plating layer formed on the metal film layer and is formed such that a thickness of the electrolytic plating layer of the wiring in the third section increases from the first section side toward the second section side.

20. The wiring substrate according to claim 15, wherein the wiring in the conductor layer is formed such that a difference in wiring width between the first section and the second section is 10 µm or less and that a difference in wiring thickness between the first section and the second section is 15 µm or less.

* * * * *